United States Patent [19]

Smith

[11] 4,193,126

[45] Mar. 11, 1980

[54] I²L RAM UNIT

[75] Inventor: Kent F. Smith, Salt Lake City, Utah

[73] Assignee: General Instrument Corporation, Clifton, N.J.

[21] Appl. No.: 966,020

[22] Filed: Dec. 4, 1978

[51] Int. Cl.² .............................................. G11C 11/40
[52] U.S. Cl. ..................................... 365/174; 357/45; 365/154
[58] Field of Search ............... 365/154, 174, 178, 179; 357/40, 45, 46

[56] References Cited

U.S. PATENT DOCUMENTS 3,177,374  4/1965  Simonian ............................. 365/174

Primary Examiner—Terrell W. Fears
Attorney, Agent, or Firm—James and Franklin

[57] ABSTRACT

The memory unit comprises a plurality of bipolar inverter transistors and an equal number of injector transistors, each of which acts as a current source for a different one of the inverter transistors. Means are provided for cross-coupling a first and a second of the inverter transistors to form a flip-flop. Third, fourth and fifth inverter transistors provide input data flow from the data line to the cross-coupled first and second inverters, in accordance with a write control sixth inverter transistor connected to receive a write signal. A seventh inverter transistor provides data output flow between the cross-coupled first and second inverter transistors and the data line in accordance with the read control eighth inverter transistor connected to receive a read signal.

13 Claims, 3 Drawing Figures

I²L RAM UNIT

The present invention relates to I²L technology, and more particularly, to a random access memory unit fabricated in accordance with I²L processing techniques.

I²L (integrated-injection logic) is a relatively recent development in bipolar semiconductor fabrication techniques used in the manufacture of large-scale integrated circuits. Through this technique, it is possible to merge regions from different transistors in order to increase circuit density and eliminate previously required transistor interconnections. Moreover, the performance characteristics of I²L circuits can match or surpass those of circuits fabricated by other known techniques. For example, I²L circuits can operate faster than N-channel MOS (metal oxide semiconductor) circuits and consume less power than CMOS (complementary metal oxide semiconductor) circuits, respectively, the high speed and low power branches of the MOS family. In the bipolar world, I²L offers the means to maintain high bipolar speed as circuits reach and even surpass LSI complexities previously promised only by MOS techniques.

The fundamental I²L logic unit comprises a bipolar inverter transistor and a bipolar injector transistor. The inverter physically consists of an NPN multiemitter transistor operated in the inverse mode. In that mode, the conventional bipolar NPN emitters perform as collectors. Base drive to the NPN inverter transistor is supplied by a lateral PNP current source, referred to as an injector transistor. On the chip, certain of the diffused areas of the PNP injector are integrated (merged) with those of the NPN inverter in the bulk silicon.

I²L can be implemented in conventional bipolar epitazial technology. As a result, integrated circuit chips employing I²L can be fabricated on existing bipolar production lines, thus enabling designers to combine other bipolar technology with I²L logic on the same chip.

The high packing density of I²L results from the simplicity of its merged structure in the bulk silicon. That simplicity manifests itself in several density enhancing features of the chip layout, including, small number of contacts per gate, complete absence of diffused resistors, no wiring within cells, and easy routing of wiring between cells.

Other advantages of I²L technology include lower source voltage requirements; 0.7 volts typical, as compared to 5.0 volts typical on MOS, immunity to noise and other interference and the ability to tolerate large power source variations. Moreover, over wide ranges of logic gate speed and power dissipation, I²L exhibits a near constant power-delay product.

Because of the above-stated advantages of I²L technology, it is clear to those skilled in the art that circuits partially or completely fabricated by I²L will play a major role in future large-scale integrated circuit fabrication. It is, therefore, necessary for circuit designers to develop basic circuits of I²L which perform functions similar to the basic circuits utilized in other technologies. However, because of the different properties of I²L, new circuit designs are required in order to produce basic circuits in I²L.

One of the basic circuits currently widely used throughout the electronics industry is the memory or storage circuit. Generally, such circuits are either of the random access memory (RAM), or read only memory (ROM) variety. Random access memories comprise a matrix of memory units which can be addressed and read or written into upon command, whereas read only memories comprise a matrix of memory units which are physically fabricated to represent bits of information which, when addressed, can be read, but not altered.

Random access memory units are known in a variety of different forms, employing different numbers of transistors, depending upon the fabrication techniques utilized and the requirements of the circuit. Many of the known RAM unit configurations, such as the single transistor and three transistor MOS units, depend upon the inherent capacitance of the transistor in order to store a charge representative of either a high or a low logic state. However, in such circuits, signal restoration capability is required because the stored charge rapidly dissipates and, thus, must be periodically refreshed. Further, in certain circuit designs, reading the information on a unit destroys the charge stored thereon which must therefore be restored if the information is to be maintained.

It is, therefore, a prime object of the present invention to provide a RAM unit designed in accordance with I²L requirements and comparable with conventional bipolar technology.

It is another object of the present invention to provide an I²L RAM unit which will function at relatively high speed, with relatively low power dissipation.

It is another object of the present invention to provide an I²L RAM unit which will maintain the information stored therein as long as power is provided thereto and, thus, requires no charge restoration apparatus.

In accordance with the present invention, a memory unit is provided of the type adapted to be connected to a power source, a data input/output flow line, a read command line, and a write command line in a random access memory (RAM). The unit comprises a plurality of inverter transistors, each having a base terminal, an emitter terminal operably connected to ground, and one or more collector terminals. An equal number of injector transistors are provided and each acts as a current source for a different one of the inverter transistors. The injector transistors each have a base terminal operably connected to ground, an emitter terminal operably connected to the power source and a collector terminal which is operably connected to the base terminal of one of the inverter transistors. Thus, the base terminal of each of the inverter transistors is connected to a collector terminal of one of the injector transistors.

Means are provided for cross-coupling a first and a second of the inverter transistors to form a flip-flop configuration. The state of the flip-flop is determined by the data stored therein. Means, interposed between and operably connected to the read command, write command, and data flow lines on the one hand, and the cross-coupled first and second inverter transistors on the other hand, are provided to control the data flow between the data line and the cross-coupled first and second inverter transistors in accordance with signals applied to the read and write command lines.

The data flow control means comprises read control means, write control means, data input flow means, and data output flow means. The data input flow means includes a third inverter transistor, the base terminal of which is connected to the data flow line; a fourth inverter transistor, the base terminal of which is connected, through a first junction, to the collector of the third inverter transistor and a fifth inverter transistor, the base terminal of which is connected, through a second junction, to a collector terminal of the fourth inverter transistor. The other collector terminal of the fourth inverter transistor and the collector terminal of the fifth inverter transistor are operably connected to the collector terminals of the cross-coupled first and second inverter transistors, respectively.

The write control means includes a sixth inverter transistor, the base terminal of which is operably connected to the write command line and first and second collector terminals of which are operably connected to the first and second junctions, respectively.

The data output flow means includes a seventh inverter transistor having a base terminal operably connected, through a third junction, to a collector terminal of one of the cross-coupled first and second inverter transistors. A collector terminal of the seventh inverter transistor is operably connected to the data input/output flow line.

The read control means includes an eighth inverter transistor, the base of which is operably connected to the read command line. The collector of the eighth inverter transistor is operably connected to the third junction.

Each of the inverter transistors comprises a vertical NPN bipolar transistor. Each of the injector transistors comprises a lateral PNP bipolar transistor. Each injector transistor acts as a current source for the inverter transistor associated therewith.

To the accomplishment of the above and to such other objects as may hereinafter appear, the present invention relates to an I$^2$L RAM unit as described in the following specification and set forth in the annexed claims, taken together with the accompanying drawings, wherein like numerals refer to like parts, and in which:

Figure 1:
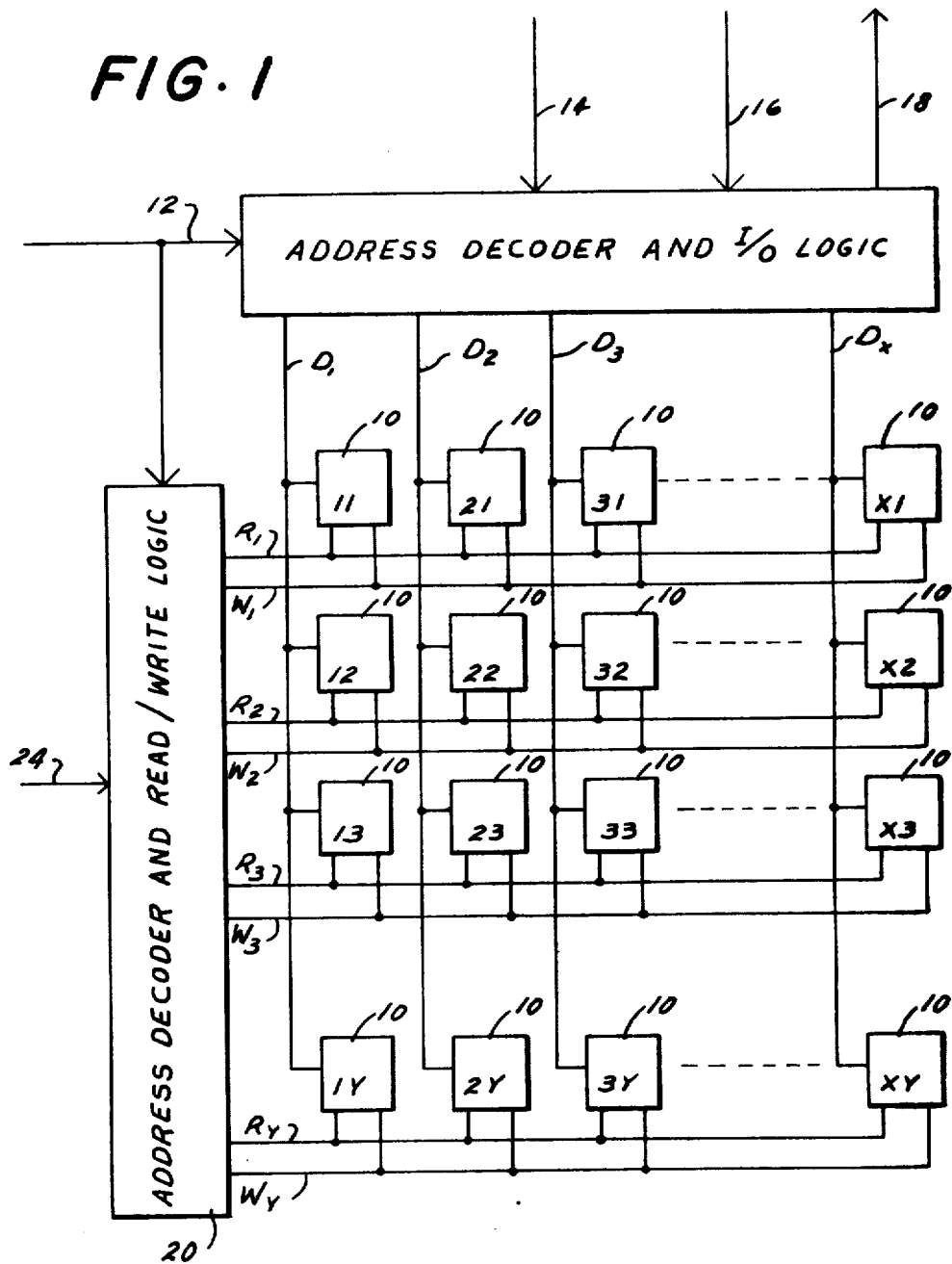
FIG. 1 is a block diagram of a typical random access memory having a plurality of memory units of the type of the present invention.

FIG. 1 illustrates a matrix array of memory units of the type of the present invention and the peripheral address decoder, input/output logic, and read/write logic circuitry associated therewith. It is to be appreciated that the address decoder, input/output logic and read/write logic are conventional bipolar circuits well known in the art for performing these functions. These circuits form no portion of the present invention and are, therefore, not disclosed in detail.

The memory cells 10 are arranged in columns and rows, the specific number of each being a matter of design choice. However, for easy reference, the columns have been designated 1 ... x, and the rows have been designated 1 ... y, such that the cell 10 in the first column and first row is designated 1—1, etc. and the cell 10 in the last column and last row is designated x-y.

Each memory unit or cell 10 has three external connections. Each cell 10 is connected to a vertical data input/output flow line, to a horizontal write command line and to a horizontal read command line. Each of the vertical data input/output flow lines, designated D1 ... Dx, respectively, is connected to a separate output of an address decoder and input/output logic circuit 11. Address decoder and input/output logic circuit 11 is adapted to receive read and write command signals from a read/write command signal line 12, address code signals on an address code line 14, and input data on a data-in line 16. Circuit 11 is also connected to a data-out line 18.

Each of the horizontal read lines, designated R1 ... Ry, and each of the horizontal write lines, designated W1 ... Wy is connected to a separate output of an address decoder and read/write logic circuit 20. Address decoder and read/write logic circuit 20 receives read and write command signals from a read/write command line 12 and address code signals from an address code line 24.

Normally, the signals applied to each of the write W1 ... Wy lines and each of the read lines R1 ... Ry are high, that is, at the logic one state. This maintains the storage portion of the memory units isolated from the respective data input/output flow lines D1 ... Dx. Two operations are possible, read and write. Prior to each operation, a coded address signal, generated by address circuitry (not shown) of conventional design, is received by circuits 11 and 20 from lines 14 and 24, respectively. The coded address signal is decoded by each of the circuits 11 and 20, such that a unique cell 10 is selected for a particular operation. A read/write command signal, generated by the appropriate conventional circuitry (not shown) is received by each of the circuits 11, 20 from line 12 indicating which type of operation is to be performed.

For example, assume that a read operation is to be performed on cell 1—1. For a read operation, circuit 20 generates a low state, that is, a logic zero, on the read line associated with the row of cells in which the cell to be read is situated. Thus, if cell 1—1 is to be read, the signal on line R1 is changed from the high state to the low state by circuit 20, all of the other read lines R2 ... Ry and all of the write lines W1 ... Wy remaining at the high, logic one state. This causes the storage portion of cell 1—1 to be connected to vertical data input/output flow line D1. Data input/output flow line D1 is connected, by circuit 11, to data output line 18 such that the data stored in cell 1—1 appears on data output line 18. It should be noted that the storage portions of the remainder of the cells in row 1, that is, cells 2-1, 3-1 ... x-1 are also connected to the respective data input/output flow lines D2 ... Dx when read line R1 goes to the low state. However, since circuit 11 does not connect lines D2 ... Dx to data output line 18, because only column 1 has been addressed, same has no effect on the output data. Further, since the memory cell of the present invention has a non-destructive read-out, the fact that the unaddressed cells in row 1 have been connected to their respective data input/output flow lines, does not adversely affect the data stored therein.

A write operation on cell 1—1 is accomplished by causing the write line, W1 of the row selected in accordance with the address code to change to the low, that is, logic zero state, while all of the other write lines W2 ... Wy and all of the read lines R1 ... Ry are maintained in the logic one state. The data to be written into the cell is applied to the data-in line 16. The data input/output flow line D1, selected in accordance with the address code, is connected to the data-in line 16 by circuit 11 such that the data to be written into the selected cell is applied to the data input/output flow line associated with that cell and, thereafter, written into the storage portion of the selected cell.

For example, if a logic one is to be written into cell 1—1, a logic one state appears on data-in line 16. Circuit 11 causes line 16 to be connected to data input/output flow line $D_1$. Circuit 20 causes write line $W_1$ to go to the low or logic zero state, while maintaining all of the other write lines $W_2 \ldots W_y$ and all of the read lines $R_1 \ldots R_y$ in the logic one state. After the information on data input/output flow line $D_1$ has been written into the storage portion of cell 1—1, data input/output line $D_1$ is disconnected from data in line 16 by circuit 11 and write line $W_1$ is returned to the logic one state, thereby isolating the storage portion of cell 1—1 from data input/output flow line Dl.

Figure 2:
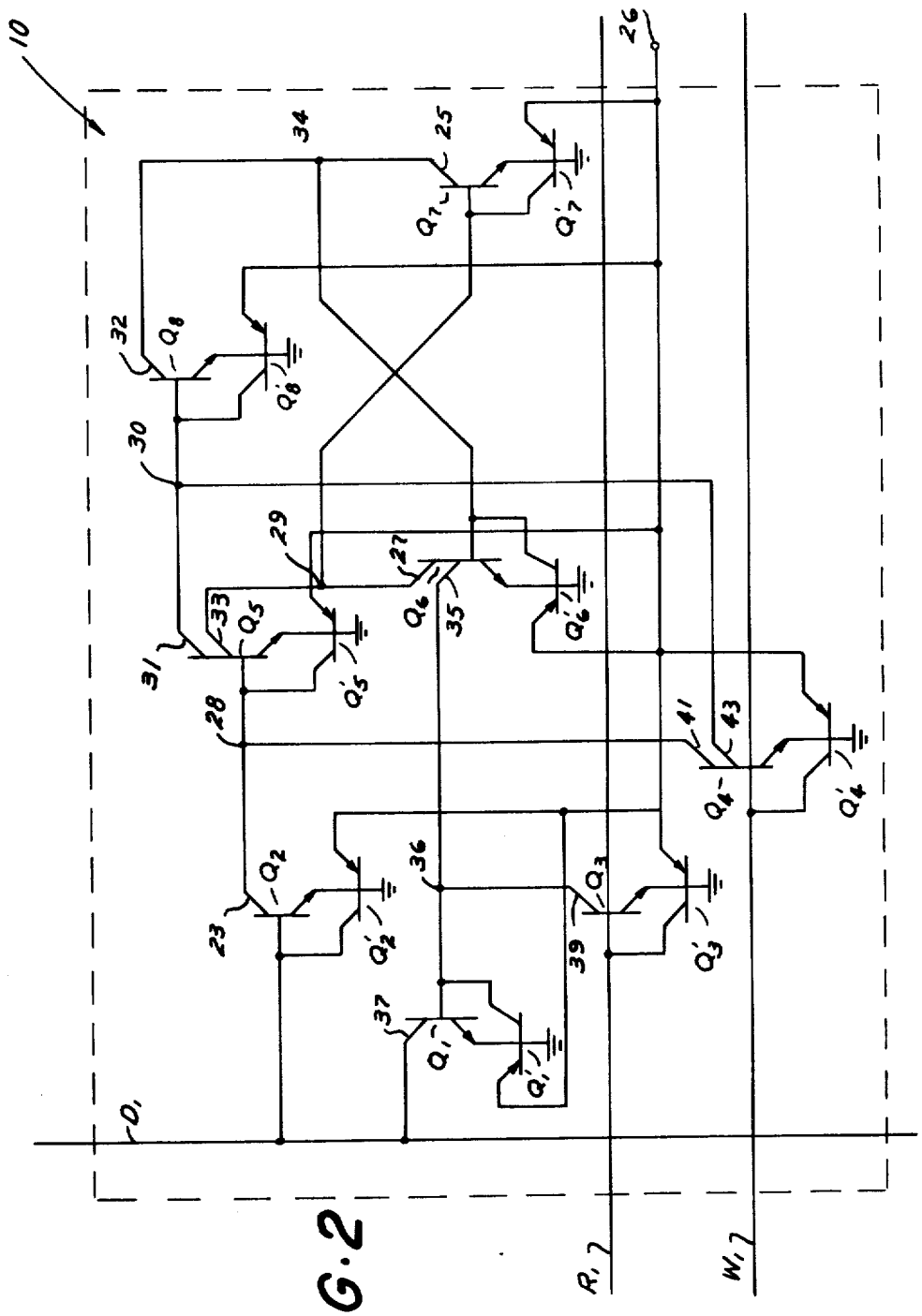
FIG. 2 is a schematic diagram of an I$^2$L RAM unit of the present invention.

The internal operation of the I²L RAM unit of the present invention can best be appreciated by referring to FIG. 2, which is a schematic diagram of a typical unit 10. While only a single cell 10 has been selected for purposes of illustration, it is to be appreciated that all of the cells 10 are identical in structure. The cell comprises eight inverter transistors $Q_1-Q_8$, each comprising a vertical bipolar NPN transistor. Each of the inverter transistors is operated in the inverse mode such that the multi-emitters thereof are operated as collectors and are referred to by that nomenclature herein.

Connected to each of the inverter transistors $Q_1$ through $Q_8$ is an injector transistor $Q_1'$ through $Q_8'$, respectively, which is a lateral bipolar PNP transistor which acts as a current source for the associated inverter transistor. More particularly, each of the inverter transistors $Q_1-Q_8$ has one or more collector terminals, a base terminal which is connected to the collector of the associated injector transistor and an emitter terminal which is connected, through the base of the associated injector transistor, to ground. The emitter of each of the injector transistors $Q_1'$ through $Q_8'$ is connected to a common bus 26, which, in turn, is connected to a positive power source (not shown).

Each injector transistor provides the base drive for the inverter transistor associated therewith through the collector of the injector transistor which is connected to the base of the inverter transistor. Since the interconnections between each inverter transistor and the associated injector transistor are identical, the circuit of FIG. 2 is described herein by discussing only the interconnection between the inverter transistors, it being understood that each inverter transistor has an injector transistor connected therewith to act as a current source therefor.

Transistors Q6 and Q7 are cross-coupled to form a flip-flop configuration. The base terminal of transistor Q6 is connected to the collector terminal 25 of transistor Q7. Similarly, the base terminal of transistor Q7 is connected to a collector terminal 27 of transistor Q6 through a junction node 29. Transistors Q2, Q5 and Q8 are operably interposed between the cross-coupled transistors Q6 and Q7, on the one hand, and the data input/output line $D_1$ on the other, so as to form a data input means. The base of transistor Q2 is connected to data input/output flow line $D_1$. The base of transistor Q5 is connected to the collector 23 of transistor Q2 through a junction node 28. The base of transistor Q8 is connected to a collector 31 of transistor Q5 through junction node 30. A collector 33 of transistor Q5 is connected to the base of transistor Q7 and the collector 27 of transistor Q6 through junction node 29. The collector 32 of transistor Q8 is connected to the base of transistor Q6 and the collector 25 of transistor Q7 through a junction node 34.

Transistor Q1 is operatively interposed between cross-coupled transistors Q6 and Q7, on the one hand, and data input/output flow line $D_1$ on the other, so as to form an output data flow means. Transistor Q1 has its base terminal connected to a collector terminal 35 of transistor Q6 through a junction node 36. The collector terminal 37 of transistor Q1 is connected to data input/output flow line $D_1$.

Transistors Q3 and Q4 are operatively connected to the read and write lines, respectively, and act as read control means and write control means, respectively. Transistor Q3 has its base terminal connected to read line $R_1$ and its collector terminal 39 connected to node 36. Transistor Q4 has its base terminal connected to write line $W_1$ and its collector terminals 41, 43 connected to nodes 28 and 30, respectively.

Normally, the cell would be unselected with a logic one on both read line $R_1$ and write line $W_1$. A logic one would be a voltage level of approximately 0.7 volts and a logic zero would be a voltage level of approximately 0.1 volts. The logic one on read and write lines $R_1$ and $W_1$, respectively, causes the read control means Q3 and write control means Q4 to be conductive, causing nodes 28, 30 and 36 to be at ground, such that transistors Q1, Q5 and Q8 are non-conductive, isolating cross-coupled transistors Q6 and Q7 from data input/output flow line Dl. This causes the flip-flop composed of transistors Q6 and Q7, which is the storage portion of the cell, to be locked in its present state.

A write operation is accomplished by applying the desired data to be written into the storage portion of the cell on the data input/output flow line associated with the column of cells in which the selected cell is situated, in this case, $D_1$. The write line associated with the row of cells in which the selected cell is situated is driven from a logic one to a logic zero while the corresponding read line associated with the selected row, in this case, $R_1$, as well as all of the other read and write lines $R_2-R_y$ and $W_2-W_y$, remain at the logic one state. The application of a logic zero on write line $W_1$ causes transistor Q4 to become non-conductive, causing the data input flow means, consisting of transistors Q2, Q5 and Q8 to connect data input/output flow line $D_1$ to the flip-flop consisting of transistors Q6 and Q7. This will cause the flip-flop to assume a state which corresponds to the data on the data input/output flow line $D_1$.

For instance, if line $D_1$ is at a logic one state, transistor Q2 will turn on, transistor Q5 will turn off, and transistor Q8 will turn on. This will cause transistor Q6 to turn off and transistor Q7 to turn on. On the other hand, if the data on data input/output line is low, that is, at a logic zero state, transistor Q2 will remain non-conductive, transistor Q5 will turn on, and transistor Q8 will turn off. This will cause transistor Q7 to turn off and transistor Q6 to turn on. Thus, when the logic state of write line $W_1$ becomes low, the state of the flip-flop consisting of cross-coupled transistors Q6 and Q7 will conform to the state of the data applied to data input/output line $D_1$. When the state of write line $R_1$ returns to the high or logic one state, the flip-flop consisting of transistors Q6 and Q7 will again be isolated from data input/output flow line $D_1$.

A read operation is accomplished by driving the read line associated with the row in which the selected cell is situated, in this case, read line $R_1$, to the logic zero state while maintaining all of the other read lines $R_2-R_y$ and and all of the write lines $W_1-W_y$ in the logic one state. The application of the logic zero state to read line $R_1$ causes transistor Q3 to turn off, thereby causing the data output flow means, transistor Q1, to connect the flip-flop consisting of cross-coupled transistors Q6 and Q7 to data input/output flow line $D_1$. If transistor Q6 is conductive, this will cause transistor Q1 to turn off such that data input/output flow line $D_1$ is not connected to ground and, thus, is at a logic one state. On the other hand, if transistor Q6 is in the non-conductive state, then transistor Q1 will turn on, grounding data input-/output flow line $D_1$ and causing same to assume the logic zero state. Thus, when transistor Q3 is turned on by a logic zero on read line $R_1$, the state of the flip-clop comprised of cross-coupled transistors Q6 and Q7 is applied to the data input/output line $D_1$.

Figure 3:
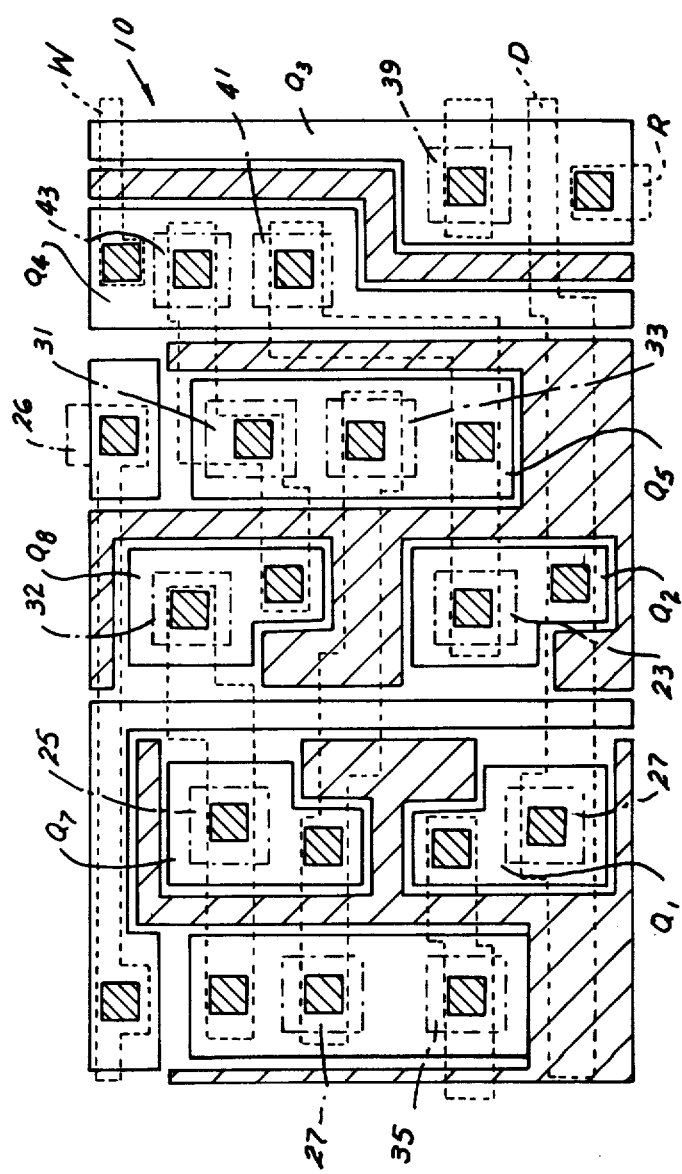
FIG. 3 is a composite layout of the I$^2$L RAM unit of the present invention showing the topology thereof.

FIG. 3 shows a typical composite layout of a memory cell 10 of the present invention. The dotted lines represent metal; the left cross-hatch boxes represent contact holes; the dash-dot lines represent the collector diffusion; the solid lines represent the base diffusion; and the right cross-hatch areas represent the isolation collar. FIG. 3 illustrates a typical I²L process layout and serves only to represent a known method for fabricating the memory cell of the present invention. Other more sophisticated processes would lend themselves to the general concept of the memory cell of the present invention.

While only a single embodiment of the present invention has been disclosed herein for purposes of illustration, it is obvious that many variations and modifications could be made thereto. It is intended to cover all of these variations and modifications which fall within the scope of the present invention, as defined by the following claims:

I claim:

1. A memory unit for use in a memory circuit of the type having a power source, a data input/output line, a read line and a write line, said unit comprising a given number of inverter transistors, each having a base terminal, an emitter terminal operably connected to ground, and one or more collector terminals and said given number of injector transistors, each having a base terminal operably connected to ground, an emitter terminal operably connected to the power source and a collector terminal operably connected to the base terminal of a different one of said inverter transistors, respectively, means for cross-coupling a first and a second of said inverter transistors to form a flip-flop configuration, the state of said flip-flop being determined by the data stored therein and means operably interposed between and operably connected to the read, write and data lines, on the one hand, and said cross-coupled first and second inverter transistors, on the other hand, to control data flow between the data line and said cross-coupled first and second inverter transistors in accordance with signals applied on the read and write lines.

2. The unit of claim 1, wherein said data flow control means comprises read control means, write control means, data input flow means, and data output flow means.

3. The unit of claim 2, wherein said data input flow means is operably connected between the data flow line and said cross-coupled first and second inverter transistors.

4. The unit of claim 3, wherein said write control means is operatively interposed between said data input flow means and said cross-coupled first and second inverter transistors and serves to operatively connect said data input flow means with said cross-coupled first and second inverter transistors.

5. The unit of claim 2, wherein said data output flow means is operably connected between the data flow line and said cross-coupled first and second inverter transistors.

6. The unit of claim 5, wherein said read control means is operatively interposed between said data output flow means and said cross-coupled first and second inverter transistors and serves to operatively connect said data output flow means with said cross-coupled first and second inverter transistors.

7. The unit of claim 2, wherein said data input flow means comprises a third inverter transistor, the base terminal of which is connected to the data flow line; a fourth inverter transistor, the base terminal of which is connected, through a first junction, to the collector of said third inverter transistor; and a fifth inverter transistor, the base terminal of which is connected, through a second junction, to a collector terminal of said fourth inverter transistor, the other collector of said fourth inverter transistor and the collector terminal of said fifth inverter transistor being operably connected to the collector terminals of said cross-coupled first and second inverter transistors, respectively.

8. The unit of claim 7, wherein said write control means comprises a sixth inverter transistor, the base terminal of which is operably connected to the write line and first and second collector terminals of which are operably connected to said first and second junctions, respectively.

9. The unit of claim 2, wherein said data output flow means comprises a seventh inverter transistor having a base terminal operably connected, through a third junction, to a collector terminal of one of said cross-coupled first and second inverter transistors and a collector terminal of which is operably connected to the data line.

10. The unit of claim 9, wherein said read control means comprises an eighth inverter transistor, the base of which is operably connected to the read line and the collector of which is operably connected to said third junction.

11. The unit of claim 1, wherein each of said inverter transistors comprises a vertical NPN bipolar transistor.

12. The unit of claim 1, wherein said injector transistor comprises a lateral PNP bipolar transistor.

13. The unit of claim 11, wherein said injector transistor comprises a lateral PNP bipolar transistor.

* * * * *